US010859022B2

(12) United States Patent
Milanese et al.

(10) Patent No.: US 10,859,022 B2
(45) Date of Patent: Dec. 8, 2020

(54) PROCESS FOR DESIGNING A VIRTUAL SENSOR, CORRESPONDING VIRTUAL SENSOR, SYSTEM, AND COMPUTER-PROGRAM PRODUCTS (71) Applicant: Modelway S.r.l., Turin (IT)

(72) Inventors: Mario Milanese, Turin (IT); Carlo Novara, Turin (IT); Stefano Mosca, Turin (IT); Mario Bonansone, Turin (IT)

(73) Assignee: Modelway S.r.l., Turin (IT)

( * ) Notice: Subject to any disclaimer, the term of this patent is extended or adjusted under 35 U.S.C. 154(b) by 0 days.

(21) Appl. No.: 16/338,220

(22) PCT Filed: Sep. 26, 2017

(86) PCT No.: PCT/IB2017/055843
§ 371 (c)(1),
(2) Date: Mar. 29, 2019

(87) PCT Pub. No.: WO2018/060847
PCT Pub. Date: Apr. 5, 2018

(65) Prior Publication Data
US 2020/0032731 A1 Jan. 30, 2020

(30) Foreign Application Priority Data

Sep. 30, 2016 (IT) ........................ 102016000098423

(51) Int. Cl.
*F02D 41/14* (2006.01)
*G06F 30/15* (2020.01)
(Continued)

(52) U.S. Cl.
CPC ........ *F02D 41/1462* (2013.01); *F01N 11/007* (2013.01); *F02D 41/021* (2013.01);
(Continued)

(58) Field of Classification Search
CPC ............... F02D 41/1462; F02D 41/021; F02D 2200/022; F02D 2200/024;
(Continued)

(56) References Cited

U.S. PATENT DOCUMENTS

2003/0105575 A1* 6/2003 Haskara .............. F02D 41/1403
701/101
2003/0216855 A1 11/2003 Liang et al.
(Continued)

OTHER PUBLICATIONS

Lipschitz Continuity, Convexity, Subgradients (Marco Tulio Ribeiro), (Apr. 2, 2015), (retrieved from the Internet on Apr. 14, 2020).*
(Continued)

*Primary Examiner* — Mahmoud Gimie
(74) *Attorney, Agent, or Firm* — Nixon & Vanderhye P.C.

(57) ABSTRACT

Described herein is a process for designing a virtual sensor that is able to estimate a variable of interest v as a function of a set of available variables $u_i$. The process comprises the steps of: —acquiring (1002) a design data-set $D_d$ comprising a number N of measured values v(ti) of the variable of interest v and corresponding measured values ũi(ti) of the available variables $u_i$; —determining a limit δ on the disturbances of the available variables $u_i$ and a limit η on the errors of the method of measurement of the variable of interest v; —selecting (1004) a Lipschitz function $f^*$ with a respective Lipschitz constant γ, which is able to estimate the variable of interest v(t) as a function of a number n of past values of each available variable $u_i$, by executing the following steps one or more times for different numbers n: a) determining a value for the Lipschitz constant y; b) defining (1006) a maximum limit $\bar{f}(r(t))$ and a minimum limit $\underline{f}(r(t))$ for the estimate of the variable of interest v as a function of the design data-set $D_d$, and moreover the number n, the value for the Lipschitz constant y, the limit δ on the disturbances of the available variables $u_i$, and the limit η on the errors of
(Continued)

the method of measurement of the variable of interest v, and choosing a Lipschitz function $f^*$ comprised between the maximum limit $\overline{f}(r(t))$ and the minimum limit $\underline{f}(r(t))$; c) determining (1008) an estimation error $\varepsilon^*(f^*)$ for the Lipschitz function $f^*$ and selecting the Lipschitz function $f^*$, associated to which is a respective Lipschitz constant $y^*$ and a respective number $n^*$, that presents the minimum estimation error $\varepsilon^*(f^*(y^*, n^*))$; and —implementing (1012) the selected Lipschitz function $f^*$ in an electronic circuit.

11 Claims, 5 Drawing Sheets

(51) Int. Cl.
    *F01N 11/00*     (2006.01)
    *F02D 41/02*     (2006.01)

(52) U.S. Cl.
    CPC ........ *G06F 30/15* (2020.01); *F02D 2200/022* (2013.01); *F02D 2200/024* (2013.01); *F02D 2200/0408* (2013.01); *F02D 2200/0416* (2013.01); *F02D 2200/0418* (2013.01); *F02D 2200/0604* (2013.01); *F02D 2200/101* (2013.01); *F02D 2200/1004* (2013.01)

(58) Field of Classification Search
    CPC ..... F02D 2200/0408; F02D 2200/0416; F02D 2200/0418; F02D 2200/0604; F02D 2200/1004; F02D 2200/101; F01N 11/007; G06F 30/15
    USPC .......................................................... 701/102
    See application file for complete search history.

(56) References Cited

U.S. PATENT DOCUMENTS

| | | |
|---|---|---|
| 2005/0022789 A1 | 2/2005 | Palma et al. |
| 2010/0050025 A1 | 2/2010 | Grichnik et al. |
| 2014/0012791 A1 | 1/2014 | Grichnik et al. |
| 2018/0266354 A1* | 9/2018 | Landolsi ................. F02D 41/18 |

OTHER PUBLICATIONS

International Search Report and Written Opinion of the ISA for PCT/IB2017/055843, dated Jan. 19, 2018, 14 pages.

* cited by examiner

PROCESS FOR DESIGNING A VIRTUAL SENSOR, CORRESPONDING VIRTUAL SENSOR, SYSTEM, AND COMPUTER-PROGRAM PRODUCTS

This application is the U.S. national phase of International Application No. PCT/IB2017/055843 filed 26 Sep. 2017, which designated the U.S. and claims priority to IT Patent Application No. 102016000098423 filed 30 Sep. 2016, the entire contents of each of which are hereby incorporated by reference.

TECHNICAL FIELD

The present disclosure relates to solutions for designing a virtual sensor and to a corresponding virtual sensor. The solutions described herein are particularly useful for designing a virtual sensor that is able to estimate in real time emissions ($NO_x$, PM, HC, CO, etc.) of heat engines in the automotive field.

DESCRIPTION OF THE PRIOR ART

Generation of exhaust gases deriving from the combustion of air and fuel (especially in diesel engines in which the fuel mixture is heterogeneous) depends upon many factors, such as high combustion temperature, high presence of oxygen in the combustion chamber, and long time of stay in these conditions. In addition to the products of complete combustion, also undesirable pollutant substances such as uncombusted hydrocarbons (HC), nitrogen oxides ($NO_x$), carbon monoxide (CO), and particulate matter (PM) are emitted.

The emissions of pollutant substances have been limited for commercially available vehicles with the introduction in the last few decades of increasingly stringent standards, which force automobile manufacturers to develop solutions for abatement of substances of this sort, such as EGR (Exhaust-Gas Recirculation), SCR (Selective Catalytic Reduction), DOC (Diesel Oxidation Catalyst), and DPF (Diesel Particulate Filter). EGR is a system that enables recirculation of a portion of exhaust gases in the intake manifold of the engine. The above gases are inert gases that do not participate in combustion, thus reducing the amount of mixture useful for combustion itself. Consequently, by reducing the temperature in the chamber, there is a drop in the emission of $NO_x$. DOC combines oxygen, uncombusted hydrocarbons (HC), and carbon monoxide (CO) into carbon dioxide and water vapour. DPF is a filter that has the purpose of physically filtering the particulate matter (PM). SCR enables, by means of injection of ammonia, conversion of $NO_x$ into nitrogen molecules and water.

The continuous improvement of systems for treatment of emissions requires accurate measurement information on the exhaust gases, which is used both for the abatement control systems and in order to evaluate the effective reduction of pollutant agents. For instance, for SCR control, two sensors for instantaneous measurement of $NO_x$ are typically used, positioned upstream and downstream of the SCR. However, there are various types of problems regarding these types of sensors, such as cost of the sensor and its installation, weight, periodic regeneration, ON time, and deterioration over time.

In order to overcome the above problems, considerable attention has been dedicated in the last few years to the possibility of providing solutions capable of estimating the variable of interest, which is measured by the physical sensor, using data and measurements of other variables of the combustion system, available in the engine control unit. These estimation methods, also referred to as "virtual sensors", appropriately implemented in the engine control unit, or else on other hardware platforms (microprocessors, FPGAs, ASICs, etc.), can be used either as backup, in the case of malfunctioning or failure of the physical sensor, or to avoid the need for installation thereof, with a saving on costs for purchase and installation.

A large number of processes have been proposed in the last few years regarding methods and systems for estimation of emissions. These are based upon methodologies that are very different from one another and can be grouped into two major categories: the methods based upon chemical/physical laws (for example, Kalman models and filters) and those that use data-driven methods (for example, neural networks, wavelets, etc.). All these methods lead to an estimation of the variable of interest $v(t)$ using a parametric-statistical setting, where the estimation $\hat{v}(t)$ of $v(t)$ is calculated as a nonlinear function of variables $u_1(t), \ldots, u_m(t)$ available, for example via the engine control unit:

$$\hat{v}(t_i) = \hat{f}(\tilde{r}(t_i))$$

with:

$$\tilde{r}(t_i) = [\tilde{u}_1(t_i - \Delta t), \ldots, \tilde{u}_1(t_i - \Delta t), \ldots, \tilde{u}_m(t_i - \Delta t), \ldots, \tilde{u}_m(t_i - n\Delta t)] \quad (1)$$

where $\tilde{u}_1, \tilde{u}_2, \ldots, \tilde{u}_m$ are the measured values of the variables available, for example in the engine control unit, possibly corrupted by disturbance, $t_i = i \cdot \Delta t$, where $\Delta t$ is the sampling time, and $n$ is the memory of the estimator.

The function $\hat{f}$ is chosen within an assigned family of parametric functions $\mathcal{F}(p)$:

$$\mathcal{F}(p) = \{f_p : p \in \mathbb{R}^q\} \quad (2)$$

The choice of said families $\mathcal{F}(p)$ depends upon the specific methodology used for designing the estimator. For instance, in the case where the estimator is obtained using a mathematical model based upon chemical/physical laws, the vector of parameters $p$ of size $q$ contains a number of parameters of the model, which depend upon the specific type of engine. In the case where a data-driven method is used, for example based upon neural networks, the parametric family may be described as:

$$\mathcal{F}(p) = \left\{ f_p(\tilde{r}(t)) = \sum_{j=1}^{L} \alpha_j \sigma_j(\tilde{r}(t), \beta_j); p = [\alpha_1, \ldots, \alpha_L, \beta_1, \ldots, \beta_L] \right\}$$

where $\sigma_j$ are the assigned base functions (exponentials, sigmoids, etc.). For instance, the document No. U.S. Pat. No. 6,882,929 describes a solution in which a $NO_x$ sensor is designed using an artificial neural network. Other solutions for the design/implementation and for a respective use of a virtual sensor are described in the documents Nos. EP 0 712 463 B1 and EP 0 877 309 B1.

In these methods, the estimated function $\hat{f}$ is obtained typically by choosing a specific value $\hat{p}$ for the vector $p$ typically calculated with the procedure described in what follows. It is assumed that there is a number N of data, whereby, in addition to the measured data $\tilde{u}_{t_i}$, $i=1, \ldots, m$ for the available variables, measurements $\tilde{v}$ of the variable of interest $v$ are also obtained. To assign the value $\hat{p}$ to the vector $p$, an appropriate estimation-error function $J(p)$ is calculated. For instance, one of the most widely used is:

$$J(p) = \frac{1}{N-n} \sum_{t_i=n\Delta t}^{t_i=N\Delta t} (\tilde{v}(t_i) - f_p(\tilde{r}(t_i)))^2 \quad (3)$$

In general, the value $\hat{p}$ for the vector of parameters p is hence chosen such that:

$$J(\hat{p}) = \min{}^{n}{}_{p \in \mathbb{R}_q} J(p) \quad (4)$$

Figure 1:
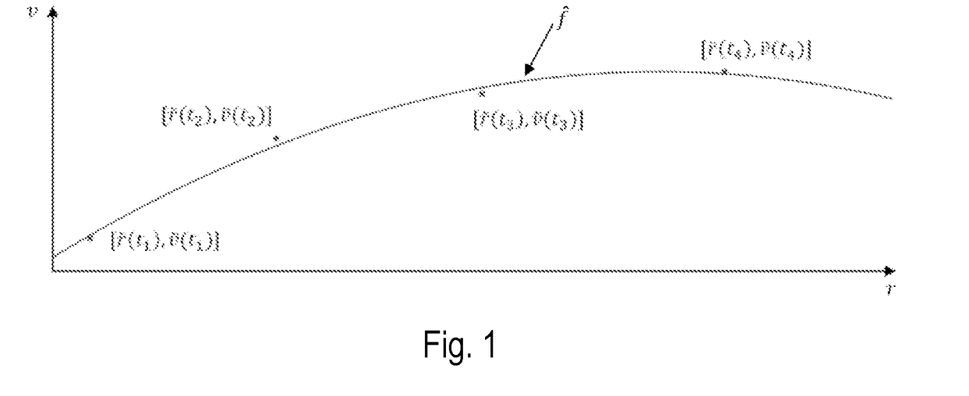

FIG. 1 shows in this context an example where just one available variable $u_1$ is considered and n=1, i.e., $\tilde{r}(t_i)=[\tilde{u}_1(t_i-\Delta t)]$. Illustrated in this figure are four data that correspond to the measured values $\tilde{r}(t_1)$, $\tilde{r}(t_2)$, $\tilde{r}(t_3)$, $\tilde{r}(t_4)$ of the available variable r and to the measured values $\tilde{v}(t_1)$, $\tilde{v}(t_2)$, $\tilde{v}(t_3)$, $\tilde{v}(t_4)$ of the variable of interest v. Moreover illustrated is the function $\hat{f}$ in the form $f_p(\tilde{r})=p_1+p_2\tilde{r}+p_3\tilde{r}^2$ that minimises the functional described by Eq. (3).

These methods, however, present important critical features. The first important critical aspect is the calculation of the value $\hat{p}$ for the vector of parameters p that will satisfy Eq. (4). For instance, typically, the function J(p) is a non-convex function and possibly presents a number of local minima. Consequently, minimisation of Eq. (4) is typically performed using iterative methods starting from an assigned initial value $p_0$. These methods are not able to guarantee in all cases reaching of the absolute minimum of J(p) and may stop at a relative minimum, with the result that the estimation performance could be even significantly inferior than what can be obtained from the absolute minimum.

A second critical aspect is the choice of the parametric family $\mathcal{F}$ (p). A fundamental problem is that of choosing the level of detail of the mathematical models in the case of methods based upon chemical/physical laws, or else the number of base functions in the case of data-driven methods. In both cases, this reflects upon the choice of the size q of the vector p. Values of q that are too small may lead to unacceptable errors. Values of q that are very large may lead to the danger of overfitting; i.e., the estimator obtained achieves acceptable errors only on the data used for deriving the estimator, but not for other data, even ones regarding normal operating conditions. In effect, there do not exist systematic methods for making this choice, which is consequently conducted in a basically empirical manner, frequently requiring even long design times.

A third important critical feature is the evaluation of the performance of the above methods in relation to the disturbance that may alter the measured variables $\tilde{u}_i$. Reliable evaluations are obtained only in very particular conditions (linearity, Gaussian disturbances, etc.), which are unlikely to arise in the estimation of complex phenomena as the ones involved in the combustion systems. In particular, in the case investigated here, an important aspect is that, on account of production spread, there may be differences between the data of some variables regarding different engines that are not easy to characterize in statistical terms. This spread may produce unacceptable deterioration in the performance of the virtual sensor designed. It would be important to design a "robust" estimator, capable of achieving acceptable performance even in the presence of production spread. However, this problem is not tackled by any method according to the prior art.

On account of these problems, none of the above methods appears to have achieved the capacity for estimating the emissions of heat engines with the necessary accuracy required by the operating conditions in which a commercially available vehicle has to work, as highlighted by the limited use on vehicles currently on the market.

OBJECT AND SUMMARY OF THE PRESENT DISCLOSURE

The main object of one or more embodiments of the present disclosure is to overcome the limitations of the solutions proposed by the prior art.

In various embodiments, the above is obtained by providing a non-parametric estimation process, which avoids the problem of search for the appropriate parametric family of the estimator. Moreover, as regards the disturbances that act on the data used for estimation, it is possible to consider information that is better suited, as compared to the statistical information required in the prior art, to taking into account the production spread. In this way, it is possible to obtain directly a so-called "optimal" estimator, preventing the problems of parametric-statistical methods due to the fact that they might stop on local minima.

Moreover, in various embodiments, the experimental data are appropriately organised in such a way as to obtain a virtual sensor, referred to as "robustly optimal virtual sensor", which minimises the effects on the estimation errors in the presence of the expected production spread on the data used for the estimate.

According to various embodiments, the above object is achieved by a process for designing a virtual sensor having the characteristics forming the subject of Claim 1. The claims also regard a corresponding virtual sensor, a system, and a computer-program product.

The claims form an integral part of the teaching provided in relation to the invention.

As mentioned previously, various embodiments of the present description regard a process for designing, i.e. producing, a virtual sensor that is able to estimate a variable of interest v as a function of a set of available variables $u_i$, which typically comprises a plurality of variables.

In various embodiments, a design data-set $D_d$ is acquired, which comprises a number N of measured values $\tilde{v}(t_i)$ of the variable of interest v and corresponding measured values $\tilde{u}_i(t_i)$ of the available variables $u_i$. For this purpose, the values of the variable of interest v and of the available variables $u_i$ can be measured and stored, during one or more experimental tests with an actuator, such as an engine, using sensors capable of measuring such values (see also FIG. 2). Moreover, a limit $\delta$ on the disturbances of the available variables $u_i$ and a limit $\eta$ on the errors of the method of measurement of the variable of interest v are determined. For instance, the limit $\eta$ on the errors of the method of measurement of the variable v can be determined on the basis of the accuracy data of the sensor used for measuring the variable of interest v during the experimental tests, and the limit or limits $\delta$ can be determined from the information on the perturbations of the measurements $\tilde{u}_i$ as a result of the process spread involved in (mass) production of the actuator used during the experimental tests and/or as a result of the different operating conditions in which the actuator is operating.

In particular, in various embodiments, the design data-set $D_d$ is modified in such a way as to add values of the variable of interest v and corresponding values of the available variables $u_i$ that do not correspond to measured values but that fall within the limit $\delta$ around measured values $\tilde{u}_i(t_i)$ of one or more available variables $u_i$ and/or within the limit $\eta$ around measured values $\tilde{v}(t_i)$ of the variable of interest v.

In various embodiments, a Lipschitz function $f^*$ with a respective Lipschitz constant ($\gamma$) is then selected, which is designed to estimate the variable of interest v(t) as a function of a number n of past values of each available variable $u_i$.

In particular, in various embodiments, the aforesaid Lipschitz function $f^*$ is chosen by executing the following steps one or more times for different numbers n.

At the start, a value for the Lipschitz constant $\gamma$ is determined. Then, there are defined a maximum limit $\bar{f}(r(t))$ and a minimum limit $\underline{f}(r(t))$ for the estimate of the variable of interest v as a function of the design data-set $D_d$, and moreover the number n, the value for the Lipschitz constant $\gamma$, the limit $\delta$ on the disturbances of the available variables $u_i$, and the limit $\eta$ on the errors of the method of measurement of the variable of interest v, and a Lipschitz function $f^{\cdot}$ is chosen comprised between the maximum limit $\bar{f}(r(t))$ and the minimum limit $\underline{f}(r(t))$. For instance, in various embodiments the value v(t) of the variable of interest v is estimated with the mean value between the maximum limit $\bar{f}(r(t))$ and the minimum limit $\underline{f}(r(t))$.

In various embodiments, there is then determined an estimation error $\varepsilon^*(f^{\cdot})$ for each Lipschitz function $f^{\cdot}$, and there is selected the Lipschitz function $f^*$, associated to which is a respective Lipschitz constant $\gamma^*$ and a respective number $n^*$, that presents the minimum estimation error $\varepsilon^*(f^*(\gamma^*, n^*))$.

In various embodiments, the selected Lipschitz function $f^*$ is then implemented in an electronic circuit. Consequently, the electronic circuit (which corresponds to the virtual sensor) is configured for estimating (by means of the Lipschitz function selected) the variable of interest v as a function of the available variables $u_i$.

For instance, in various embodiments, for this purpose the selected Lipschitz function $f^*$ is approximated with a function $f_a$ made up of base functions, and the approximated Lipschitz function $f_a$ is implemented in the electronic circuit.

For instance, in various embodiments, the variable of interest v represents a type of emission of an internal-combustion engine, such as $NO_x$ emission, and the set of available variables $u_i$ comprises one or more of the following variables: fuel demand, engine r.p.m., engine torque, percentage opening of the EGR valve, percentage closing of the VGT turbine, temperature in the intake manifold, pressure in the intake manifold, pressure in the common rail, flow of exhaust gases in the exhaust manifold, temperature of the coolant, concentration of oxygen in the combustion chamber, absolute humidity, temperature in the combustion chamber, and pressure in the combustion chamber. For instance, in various embodiments, a further virtual sensor is used for estimating the temperature in the combustion chamber and/or the pressure in the combustion chamber. For this purpose, it is possible to design at least one second virtual sensor that is able to estimate a second variable of interest v, for example the temperature in the combustion chamber or the pressure in the combustion chamber, as a function of a second set of available variables. In the embodiment considered, the second variable of interest hence corresponds to one of the available variables $u_i$ in the set of available variables $u_i$ of the first virtual sensor. In various embodiments, the first virtual sensor and the second virtual sensor can be implemented also within one and the same electronic circuit.

BRIEF DESCRIPTION OF THE DRAWINGS

Embodiments of the present description will now be described in detail with reference to the attached drawings, which are provided purely by way of non-limiting example and in which:

FIG. 1 has already been described previously;

DETAILED DESCRIPTION OF EMBODIMENTS

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of the ensuing description do not necessarily refer to one and the same embodiment. Moreover, particular conformations, structures or characteristics may be combined in any adequate manner in one or more embodiments.

The references used herein are merely provided for convenience and hence do not define the sphere of protection or the scope of the embodiments.

As mentioned previously, the present description relates to solutions for designing a virtual sensor, such as a virtual sensor that is able to estimate one or more types of emission of an internal-combustion engine, for example $NO_x$ emission of a diesel engine.

Figure 2:
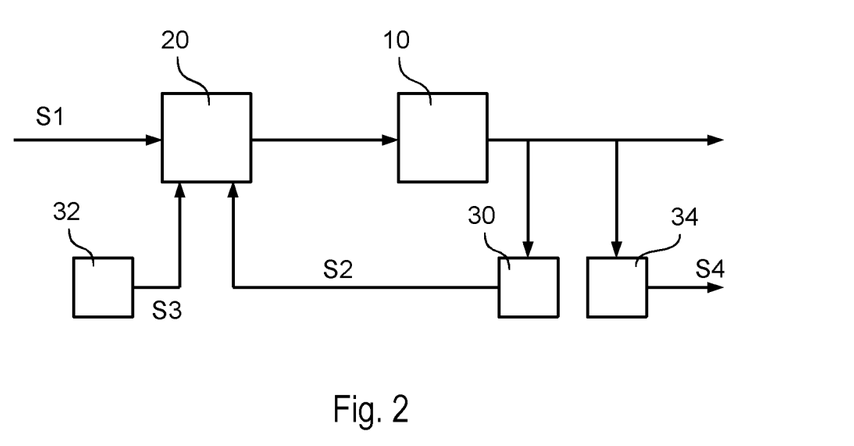
FIG. 2 shows an embodiment of a control system.

FIG. 2 shows an embodiment of a generic control system.

In the embodiment considered, the system comprises an actuator 10 and a control unit 20 configured to drive the actuator 10 on the basis of one or more control signals. For instance, in the embodiment considered, the control unit 20 can drive the actuator 10 on the basis of one or more of the following control signals:

one or more reference signals S1;

one or more signals of a feed-back type S2, i.e., signals obtained via one or more sensors 30 configured for monitoring the behaviour of the actuator 10; and one or more signals of a feed-forward type S3, i.e., signals obtained from one or more further sensors 32 that supply information useful for a predictive control.

In general, there may also be provided one or more further sensors 34 configured for monitoring the behaviour of the actuator 10, which, however, are not used for control of the actuator 10.

For instance, in various embodiments, the actuator 10 is an internal-combustion engine. In this case, the control unit

20 is typically implemented within the engine control unit, and the reference parameter S1 could be the required value of engine r.p.m.

In various embodiments, at least one of the sensors 30, 32, and/or 34 is a virtual sensor 40; i.e., at least one of the signals S2, S3, and/or S4 corresponds to an estimate $\tilde{v}$ of a variable of interest v.

In general, the virtual sensor 40 can be implemented within the control unit 20, for example in the form of a software module, or on a separate electronic board.

Figure 3:
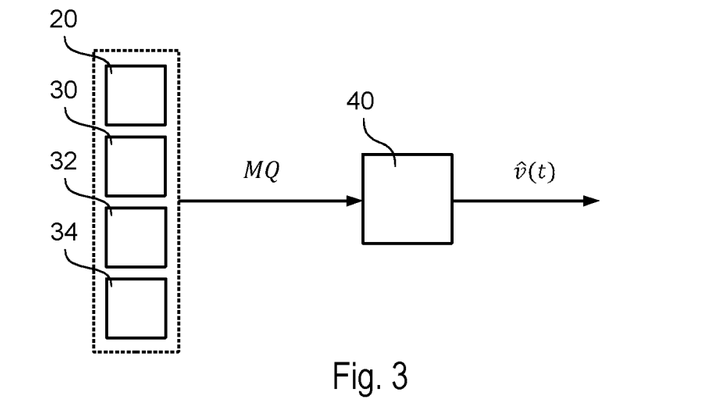
FIG. 3 shows an embodiment of a virtual sensor that can be used in the system of FIG. 2.

Consequently, as illustrated in FIG. 3, the virtual sensor 40 receives, at each sampling instant $t_i = i \cdot \Delta t$, a set of measured values $MQ = \{\tilde{u}_1, \tilde{u}_2, \ldots, \tilde{u}_m\}$ and estimates a corresponding value $\tilde{v}(t)$ for the variable of interest v(t) as a function of the measured values MQ. For instance, in the architecture illustrated in FIG. 2, the control module 20 can send these measured values to the virtual sensor 40. For example, as mentioned previously, the virtual sensor 40 could be a software module within the control unit 20 that preferably has direct access to the variables acquired and/or calculated within the control unit 20. Instead, in the case where the virtual sensor 40 is implemented on a separate electronic board, the control module 20 can exchange the values with the virtual sensor 40 through any wired or wireless communication system, such as a CAN (Controller Area Network) bus of a vehicle. In general, the virtual sensor 40 could receive one or more of the measured values also directly from the various sensors 30, 32 and/or 34.

For instance, in various embodiments, the variable of interest v(t) that is to be measured is a type of emission produced by the engine 10, for example $NO_x$. By way of example, appearing in the following table are variables that can be used in various embodiments for estimation of $NO_x$:

| Name of variable | Description |
| --- | --- |
| $\tilde{u}_1$ | Fuel demand |
| $\tilde{u}_2$ | Engine r.p.m. |
| $\tilde{u}_3$ | Engine torque |
| $\tilde{u}_4$ | Percentage opening of the EGR valve |
| $\tilde{u}_5$ | Percentage closing of the VGT turbine |
| $\tilde{u}_6$ | Temperature in the intake manifold |
| $\tilde{u}_7$ | Pressure in the intake manifold |
| $\tilde{u}_8$ | Pressure in the common rail |
| $\tilde{u}_9$ | Flow of exhaust gases in the exhaust manifold |
| $\tilde{u}_{10}$ | Temperature of the coolant |
| $\tilde{u}_{11}$ | Concentration of oxygen in the combustion chamber |
| $\tilde{u}_{12}$ | Absolute humidity |

Consequently, in general the virtual sensor 40, on the basis of the variables MQ, supplies in real time an estimate $\tilde{v}$ of the variable of interest v, for example of engine emission, such as emission of uncombusted hydrocarbons (HC), nitrogen oxides ($NO_x$), carbon monoxide (CO), or particulate matter (PM).

Figure 4:
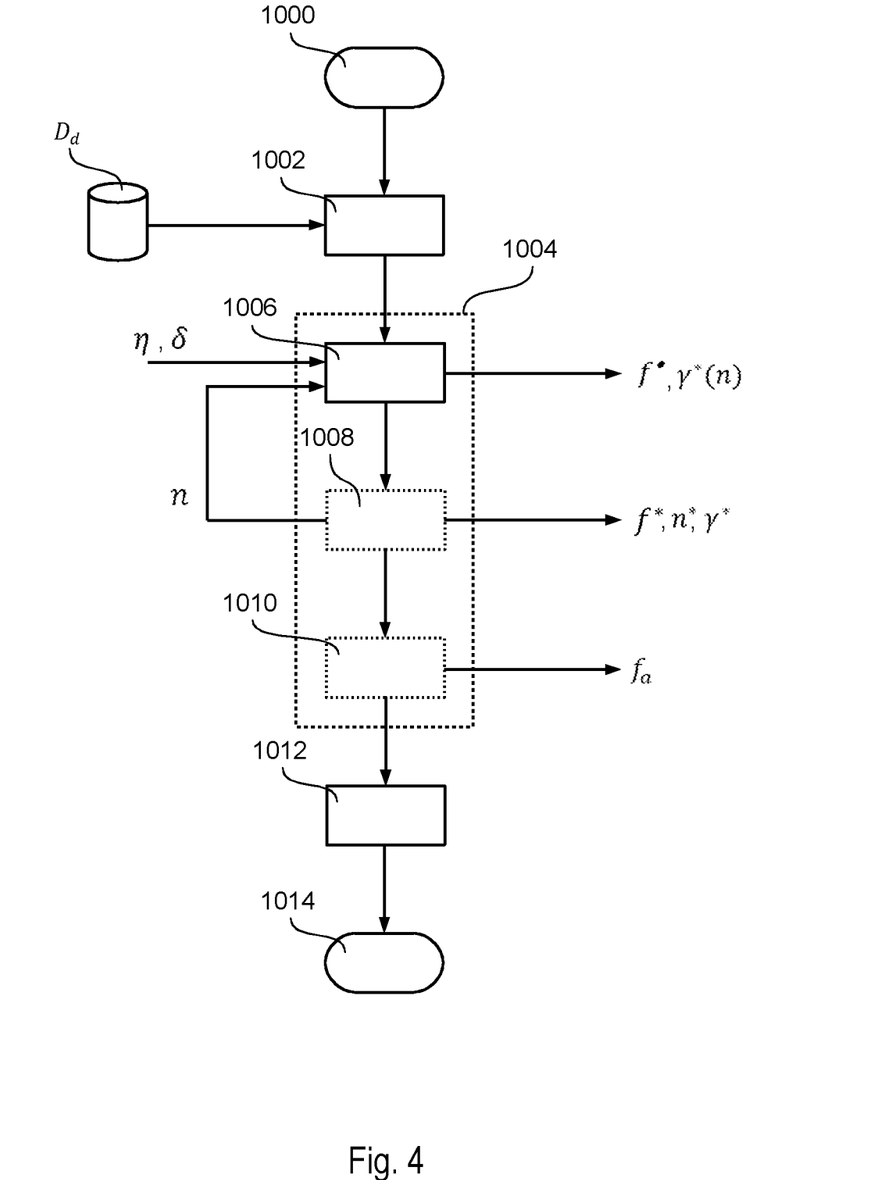
FIG. 4 illustrates a flowchart of a process for designing a virtual sensor.

FIG. 4 shows an embodiment of a process for designing the virtual sensor 40, which can be implemented, for example, within a software for the design of virtual sensors, i.e., a computer-program product that can be executed, for example, on a computer or a computing system with distributed architecture (the so-called cloud-computing system), which implements the process for automatic design of the virtual sensor 40.

After an initial step 1000, a step 1002 is carried out of acquisition of data $D_d$ for acquiring both the measured values $MQ = \{\tilde{u}_1, \tilde{u}_2, \ldots, \tilde{u}_m\}$ and the corresponding measured values $\tilde{v}$ of the variable of interest v:

$$D_d = \{\tilde{u}_1(t_i), \tilde{u}_2(t_i), \ldots, \tilde{u}_m(t_i), \tilde{v}(t_i), i = 1, \ldots, N\} \quad (5)$$

The acquisitions of the above reference data $D_d$ may be made by means of experimental measurements on a testing actuator 10, either in the laboratory or during actual operation, or else by means of simulations of an accurate model of the actuator 10, or else in part experimentally and in part by simulation. For instance, in various embodiments, the reference data $D_d$ are acquired using operating conditions that are typically considered for evaluating the performance of the actuator 10, for example of the engine and its emission levels. For instance, these conditions may comprise both dynamic tests (homologation cycles such as NEDC, WLTP, FTP, Artemis) and actual on-the-road tests, as well as stationary tests conducted on different possible engine operating points.

The set of reference data $D_d$ is then used in a step 1004 for designing the virtual sensor 40. As will be described hereinafter, in various embodiments, the step 1004 comprises a step 1006 for computing a function $f^{\circ}$ that is able to provide a robust estimate, i.e., with a guaranteed error limit even in the presence of variability of the variables $u_i$ due to the spread in the engine-production processes, an optimisation step 1008 for computing a function $f^*$ that yields a robustly optimal estimate, which minimises the guaranteed error, and an optional approximation step 1010 for approximating the function $f^*$ with a function $f_a$ with reduced computational complexity.

In various embodiments, the functions $f^{\circ}$, $f^*$, or $f_a$ may be used, in a step 1012, for implementing the virtual sensor 40. For instance, in various embodiments, step 1012 can automatically generate a source code that can be transferred onto the platform on which it will have to operate, such as a source code (for example, a C code) that can be compiled for the control unit 20 (for example, the engine control unit) or another microprocessor, or a VHDL/VERILOG code for programming of an FPGA or for implementation of an ASIC.

In general, as already mentioned in the section "Description of the prior art", an estimator of the variable of interest v based upon the variables MQ may be represented as in Eq. (1). In various embodiments, unlike the technique used in the prior art, the functions $f^{\circ}$, $f^*$, or $f_a$ are not sought within an assigned parametric family, but rather within a non-parametric family $\mathfrak{F}(\gamma)$ of continuous Lipschitz functions. For instance, in various embodiments, the following family of functions is used:

$$\mathfrak{F}(\gamma) = \{f \in \mathcal{C} : |f(\check{r}(t)) - f(\check{r}(t))| \leq \gamma \|\check{r}(t) - \check{r}(t)\|_\infty, \forall \check{r}(t), \check{r}(t) \in R_b\} \quad (6)$$

where $\mathcal{C}$ is the set of the continuous functions that operate in the space $R^{m \times n}$.

The set $R_b$ is the rectangular parallelepiped in the space $R^{m \times n}$ of minimum volume that contains the set $R_d$ made up of all the regressors formed using the data of the data-set $D_d$ and can be calculated as:

$$R_b = \left\{ r \in R^{m \times n}; \min_{i=1,\ldots,N} \tilde{u}_{j+k}(t_i) \leq r_{j+k} \leq \max_{i=1,\ldots,N} \tilde{u}_{j+k}(t_i); \right. \quad (7)$$
$$\left. k = 1, \ldots, n; j = 1, \ldots, m \right\}$$

Consequently, the set $R_b$ defines the space between the minimum and maximum measured values of the variables $\tilde{u}_i$, hence being automatically limited to the range of the values actually measured.

Figure 5:
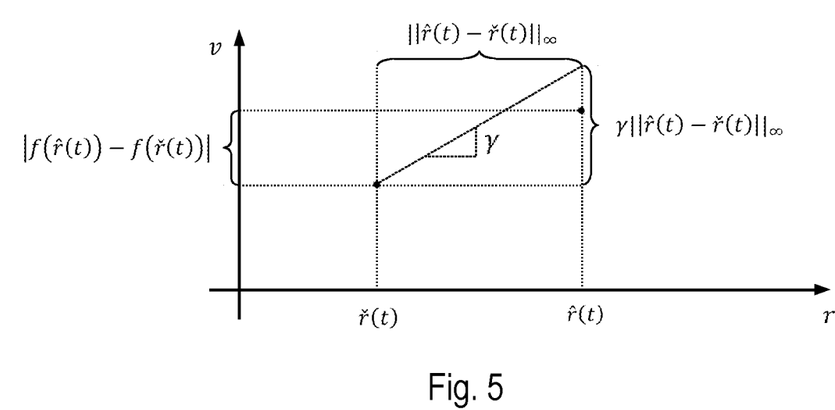
FIGS. 5, 6, and 7 show details of the design process of FIG. 4.

FIG. 5 shows, in this context, two arbitrary points $\hat{r}(t)$, $\check{r}(t)$ in the set $R_b$. Basically, Eq. (6) envisages that the distance between the two values $f(\hat{r}(t))$ and $f(\check{r}(t))$ must be less than the distance between the two points $\hat{r}(t)$, $\check{r}(t)$, determined as shown in Eq. (6), for example with the infinity norm or alternatively another norm, for example the Euclidean norm, multiplied by the Lipschitz constant $\gamma$.

The rationale for the previous choices stems from the following considerations. The actuator 10, for example the engine, which represents an emission-generation system, may, in general, be described by a system of nonlinear state equations of appropriate order n, of which the variables $u_i$ are in part the inputs and in part the measured outputs. If the variable of interest v (for example, the emission) is a continuous Lipschitz function of the state variables and can be estimated from a knowledge of the variables $u_i$, then, from the general theory of observability of nonlinear systems, there exists a function $f_0$ such that, for an appropriate value of $\gamma$, $$v(t) = f_0(r(t)), f_0 \in \mathfrak{F}(\gamma) \quad (8)$$

The function $f_0$ is in general not known, and in various embodiments an estimate thereof is directly derived from the experimental data. It may be noted that the family of functions $\mathfrak{F}(\gamma)$ where estimation functions $f^\circ$ and $f^*$ are sought is constituted by functions that, operating on measurements $u_i$ corrupted by disturbances that are not known but are limited by a value $\delta \geq |u_i - \tilde{u}_i|$, yield estimation errors that (as will be illustrated hereinafter) are limited by the amount $\gamma\delta$.

In various embodiments, this property is used in step 1004 for computing the functions $f^\circ$ and $f^*$ that enable so-called robust and robustly optimal estimators to be obtained, capable of supplying a low or even minimum estimation error that can be obtained in the various operating conditions in which the estimator will have to operate and in the presence of disturbances on the measurements $u_i$ that, on account of production spread, are not known but are smaller in modulus than $\delta$.

Moreover, the performance of any $\hat{f} \in \mathfrak{F}(\gamma)$ chosen cannot be evaluated simply by verifying that $\hat{f}$ yields on the data-set $D_d$ errors $|\tilde{v}(t_i) - \hat{v}(t_i)|$, with i=1, ..., N, that are "small". In fact, it is possible to find estimation functions that yield small or even zero errors on the data-set $D_d$, but that can present very poor performance when they operate on data-sets $D_v$ other than $D_d$, which are referred to as "validation sets":

$$D_v = \{\tilde{u}_1(t_i), \tilde{u}_2(t_i), \ldots, \tilde{u}_m(t_i), \tilde{v}(t_i), i=N+1, \ldots, M\} \quad (9)$$

In general, the data contained in the data-set $D_d$ do not yield information on the behaviour of the function $\hat{f}$ outside of the data-set $R_b$ defined in Eq. (7). In fact, two estimation functions $\hat{f}_a$, $\hat{f}_b \in \mathfrak{F}(\gamma)$ such that $\hat{f}_a(r) = \hat{f}_b(r)$, $\forall r \in R_b$ may have very different values for $r \notin R_b$. Consequently, in various embodiments, the validation sets are chosen in such a way that $R_v \subset R_b$, where $R_v$ is the set of the regressors formed using the data of the data-set $D_v$. In what follows, $\mathcal{D}_v$ is hence defined as the set of all the possible sets $D_v$ such that $R_v \subset R_b$.

In various embodiments, for assigning functions $\hat{f} \in \mathfrak{F}(\gamma)$, variability $\delta$ of the measurements, and accuracy $\eta$ of the measurement of v during the experimental tests, an error $\varepsilon(\hat{f})$ is calculated such that, for any $\tilde{r}(t) \in R_b$ formed by the data of any $D_v \in \mathcal{D}_v$, the following applies:

$$|v(t) - \hat{v}(t)| = |v(t) - \hat{f}(\tilde{r}(t))| \leq \varepsilon(\hat{f}) \quad (10)$$

In fact, from Eq. (8), we have:

$$|v(t) - \hat{v}(t)| = |f_0(r(t)) - \hat{f}(\tilde{r}(t))| \leq |f_0(r(t)) - f_0(\tilde{r}(t))| + |f_0(\tilde{r}(t)) - \hat{f}(\tilde{r}(t))| \quad (11)$$

Moreover, the limit $|u_i - \tilde{u}_i| \leq \delta$ implies that:

$$\|r(t) - \tilde{r}(t)\|_\infty \leq \delta \quad (12)$$

Consequently, from Eqs. (8) and (12), it follows that $$|f_0(r(t)) - f_0(\tilde{r}(t))| \leq \gamma \|r(t) - \tilde{r}(t)\|_\infty \leq \gamma\delta \quad (13)$$

Hence from Eqs. (11) and (13) we have $$|v(t) - \hat{v}(t)| \leq \gamma\delta + |f_0(\tilde{r}(t)) - \hat{f}(\tilde{r}(t))| \quad (14)$$

Consequently, in various embodiments, design of the virtual sensor 40 is based upon the fact that the function $f_0$ is not known, but it is known that $f_0 \in \mathfrak{F}(\gamma)$ and is such that $$|\tilde{v}(t) - f_0(\tilde{r}(t))| \leq |\tilde{v}(t) - f_0(r(t))| + |f_0(r(t)) - f_0(\tilde{r}(t))| \leq \eta + \gamma\delta \, \forall \tilde{r}(t) \in R_b \quad (15)$$

Figure 6:
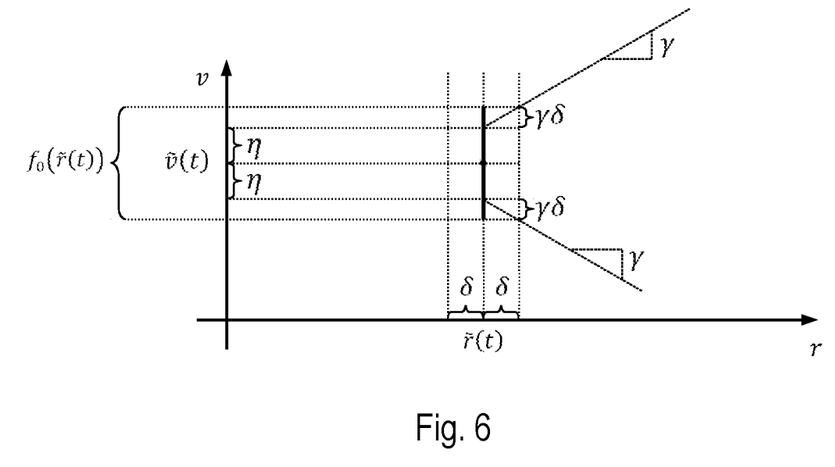

For instance, FIG. 6 shows an arbitrary measured regressor $\tilde{r}(t)$, which for simplicity comprises just one variable $u_1$, and the respective measured value $\tilde{v}(t)$. In general, the measured value $\tilde{v}$ has an uncertainty due to the measurement that is limited by $\eta$, and likewise the measured value for the variable $u_1$ has a respective limit $\delta$ on the disturbances. Consequently, the overall uncertainty, assuming that the function $f_0$ is a Lipschitz function with constant $\gamma$, is limited by the sum of $\eta$ (uncertainty of measurement of $\tilde{v}$) and $\gamma\delta$ (possible variation of the function $f_0$ in the limit $\delta$ on the disturbances of $u_1$). This uncertainty hence defines the set of values of the function $f_0$ for a given measured regressor $\tilde{r}(t)$ and respective measured value $\tilde{v}$ of the variable of interest v. As already explained, the function $f_0$ is not known. However, the design step 1006 can exploit the fact that, if the Lipschitz constant $\gamma$ is such that the set of functions FFS is not an empty set, from Eq. (15) we have the information that $$f_0 \in FFS \quad (16)$$

where $FFS = \{f \in \mathfrak{F}(\gamma): |\tilde{v}(t_i) - f(\tilde{r}(t_i))| \leq \eta + \gamma\delta, i=n, \ldots, N\}$.

Consequently, the minimum limit that may be obtained from Eq. (14) for assigned function $\hat{f} \in \mathfrak{F}(\gamma)$ is $$|v(t) - \hat{v}(t)| \leq \gamma\delta + sup_{f \in FFS} |f_0(\tilde{r}(t)) - \hat{f}(\tilde{r}(t))| \triangleq \varepsilon^*(\hat{f}), \quad (17)$$

$$\forall \tilde{r}(t) \in R_b$$

where the function sup yields the supremum.

From Eq. (17) it hence follows that for any function $\hat{f} \in \mathfrak{F}(\gamma)$, the estimate $\hat{v}(t) = \hat{f}(\tilde{r}(t))$ presents, for any validation set $D_v \in \mathcal{D}_v$, errors limited by $\varepsilon^*(\hat{f})$ in a robust way, i.e., for all the operating conditions considered in any set $D_v \in \mathcal{D}_v$, including those due to production spread that lead to disturbances on the measurements $u_i$ falling within the range $\delta$. As will be described hereinafter, the error $\varepsilon^*(\hat{f})$ is hence smaller if also in the data-set $D_d$ data are present that reflect the variability of the range $\delta$. Consequently, in various embodiments, the data-set $D_d$ is modified by entering therein data of some tests in which the range of the disturbances has been explored.

In various embodiments, in step 1006 a function $f^\circ(\gamma)$ is hence determined such as to minimise for the assigned value of $\gamma$ the limit of the estimation error:

$$\varepsilon^*(f^\circ(\gamma)) \leq \varepsilon^*(\hat{f}), \forall \hat{f} \in \mathfrak{F}(\gamma)$$

The function $f^\circ(\gamma)$ is determined as described in what follows, on the basis of the "set-membership" theory, as described, for example, in the paper by Milanese, M., Novara, C., "Set membership identification of nonlinear systems", Automatica, 40, pp. 957-975, 2004.

In particular, in various embodiments, a maximum value $\bar{f}(r(t))$ is determined for the variable v as a function of the regressor currently measured $\tilde{r}(t)$:

$$\bar{f}(r(t)) = \min_{i=n,\ldots,N}(\tilde{v}(t_i) + \eta + \gamma\delta + \gamma\|r(t) - \tilde{r}(t_i)\|_\infty) \quad (18)$$

Likewise, a minimum value $\underline{f}(r(t))$ is obtained for the variable v as a function of the regressor currently measured $\tilde{r}(t)$:

$$\underline{f}(r(t)) = \max_{i=n,\ldots,N}(\tilde{v}(t_i) - \eta - \gamma\delta - \gamma\|r(t) - \tilde{r}(t_i)\|_\infty) \quad (19)$$

Figure 7:
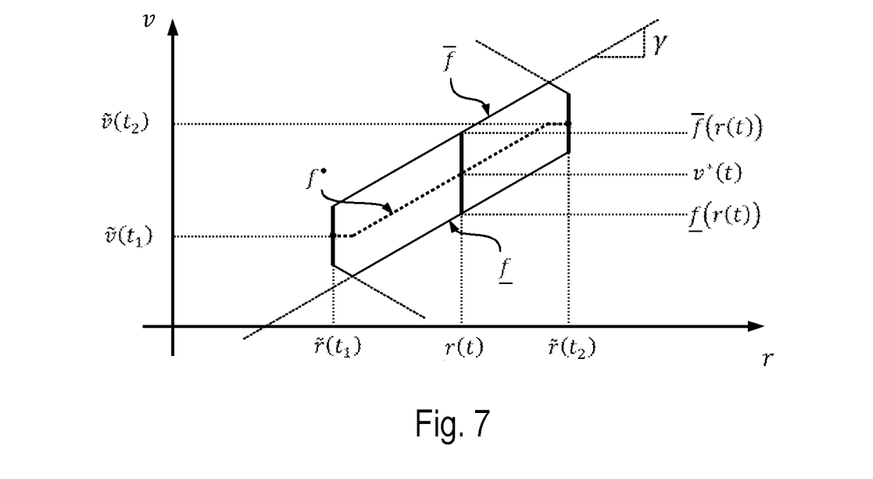

FIG. 7 shows in this context an example in which just a single available variable $\tilde{u}_1$ is considered and n=1, i.e., $\tilde{r}(t_i) = [\tilde{u}_1(t_i - \Delta t)]$. In this figure, two data are shown, which correspond, respectively, to the measured values $\tilde{r}(t_1)$, $\tilde{r}(t_2)$ and to the measured values $\tilde{v}(t_1)$, $\tilde{v}(t_2)$ of the variable of interest v, and the functions $\bar{f}$ and $\underline{f}$ are calculated according to Eqs. (18) and (19).

In various embodiments, the virtual sensor 40, in particular the processing unit 400, is configured for estimating the value v*(t) as the mean value between the maximum value $\bar{f}(r(t))$ and the minimum value $\underline{f}(r(t))$, i.e., by computing the value v*(t) with the following function $f^* \forall \tilde{r}(t) \in R_b$ (see also FIG. 7):

$$v^*(t) = f^*(r(t)) = [\underline{f}(r(t)) + \bar{f}(r(t))]/2 \quad (20)$$

Consequently, the maximum error ε* of the function $f^*$ is limited to $$\varepsilon^*(f^*) = [\underline{f}(r(t)) + \bar{f}(r(t))]/2 + \gamma\delta, \forall r(t) \in R_b \quad (21)$$

The function $f^*$ is a function of the Lipschitz constant γ and of the memory n of the estimator, the dependence of which will be expressed only if necessary and which must be chosen in such a way that the set FFS is not empty. For instance, a condition that is necessary and sufficient for this set not to be empty is the following:

$$\bar{f}(r(t_i)) > \tilde{v}(t_i) - \eta - \gamma\delta, i=n,n+1,\ldots,N-1 \quad (22)$$

In various embodiments, in step 1006 the virtual sensor 40 is designed with a given n, and the minimum Lipschitz constant γ*(n) that satisfies Eq. (22) is calculated as follows:

$$\gamma^*(n) = \min_{\gamma: \bar{f}(r(t_i)) > \tilde{v}(t_i) - \eta - \gamma\delta, i=n,n+1,\ldots,N-1} \gamma \quad (23)$$

Hence, each pair of values n, γ*(n) is such that FFS is not empty.

In various embodiments, the previous step 1006 is then repeated for other values of n in such a way as to choose a value n* such that:

$$n^* = \arg\min_n \varepsilon^*(f^*(\gamma^*(n))) \quad (24)$$

where the error ε* can be calculated in step 1008 in accordance with Eq. (21), as follows:

$$\varepsilon^*(f^*(\gamma^*,n)) = \sup_{r \in R_b}(\bar{f}(r) - \underline{f}(r))/2 + \gamma^*(n)\delta \quad (25)$$

In various embodiments, there are hence chosen n=n* and γ=γ* that enable calculation of the function $f^* = f^*(\gamma^*, n^*)$, which yields a robustly optimal estimator, i.e., one such that ε*(f*) is the minimum estimation error that can be guaranteed for any validation data-set $D_v \in \mathcal{D}_v$.

Calculation of Eq. (23) is quite easy, whereas calculation of Eq. (25) is more complex, and it is substantially possible to use the method described in the paper by Milanese, M., Novara, C., "Computation of local radius of information in SM-IBC identification of non-linear systems", J. Complexity 23, pp. 937-951, 2007.

Figure 8:
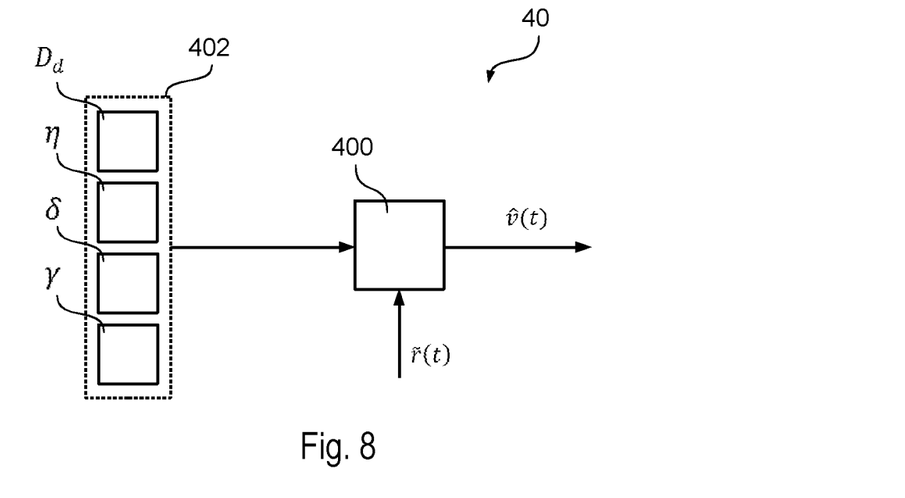
FIG. 8 illustrates an embodiment of a virtual sensor.

FIG. 8 shows in this context an embodiment of a virtual sensor 40. In the embodiment considered, the virtual sensor 40 comprises a processing unit 400, such as a microprocessor programmed with a computer program or a digital circuit, and one or more memories 402. As explained previously, the virtual sensor 40 may be implemented, for example, within the control unit 20 or on a separate electronic circuit.

In various embodiments, in step 1012 the following data are stored in the memory 402:
- the measured data in the design data-set $D_d$;
- the Lipschitz constant γ;
- data that identify the term η+γδ, for example directly the limit η on the errors of the method of measurement of the variable v and the limit δ on the disturbances of the data of the variables $u_i$.

Moreover, in various embodiments, the virtual sensor 40 is configured for receiving the current regressor $\tilde{r}(t)$ and computing the maximum value $\bar{f}(r(t))$ and the minimum value $\underline{f}(r(t))$ for the current regressor $\tilde{r}(t)$, as illustrated in Eqs. (18) and (19).

Consequently, in various embodiments, the estimator $f^*$ depends upon the experimental data included in the design data-set $D_d$, upon η, γ, δ, and upon the memory n of the estimator. In general, the memory n of the estimator may even be a vector; i.e., each available variable $\tilde{u}_i$ could have a respective memory $n_i$. In this case, the step 1006 could hence be repeated for various combinations of values $n_i$, once again choosing in step 1008 the combination that presents the minimum error, as shown in Eq. (25).

In various embodiments, the limit η on the errors of the method of measurement of the variable v can be chosen from the data of accuracy of the instrument for measuring v used during the experimental tests, and the limit δ can be derived from the information on the perturbations of the measurements $\tilde{u}_i$ resulting from process spread involved in (mass) production of the actuator 10, for example of the engine, and from the different operating conditions of the actuator 10. In general, the limit δ may even be a vector; i.e., each available variable $\tilde{u}_i$ could have a respective limit $\delta_i$. However, one or more available variables $\tilde{u}_i$ can be normalized in such a way as to use the same limit δ.

As explained previously, in various embodiments, the design data-set $D_d$ is modified in such a way as to reflect the limit η on the errors of the method of measurement of the variable v and/or the limit δ on the disturbances of the data of the variables $u_i$.

Figure 9:
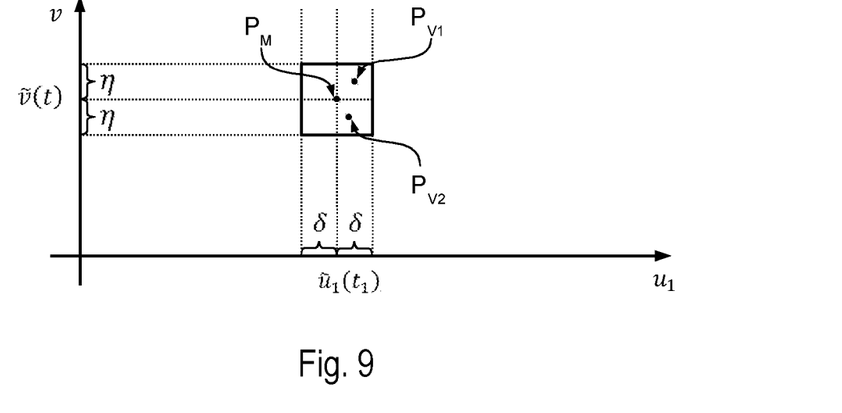
FIG. 9 shows an embodiment that enables reduction of the estimation error of the virtual sensor.

For instance, as illustrated in FIG. 9, in various embodiments, one or more data $P_V$, i.e., combinations $\{\tilde{u}_1(t_i), \tilde{u}_2(t_i), \ldots, \tilde{u}_m(t_i), \tilde{v}(t_i)\}$, are added to the data-set $D_d$ that normally contains only measured data $P_M$. In particular, these added points $P_V$ are chosen so as to reflect the limit η on the errors of the method of measurement of the variable v and/or the limit δ on the disturbances of the data of the variables $u_i$. For instance, in various embodiments one or more data $P_V$ are added within the area delimited by the limits ±η and ±δ with respect to a measured point $P_M$, thus emulating the tolerances of measurement and/or production, etc. For instance, in FIG. 9 two data $P_{V1}$ and $P_{V2}$ are added.

For example, in various embodiments, four additional data are added for each measured datum $P_{Mi} = [\tilde{r}(t_i), \tilde{v}(t_i)]$ in the data-set $D_d$; namely, $$P_{V1} = [\tilde{r}(t_i) + \delta, \tilde{v}(t_i) + \eta]$$

$$P_{V2} = [\tilde{r}(t_i) + \delta, \tilde{v}(t_i) - \eta]$$

$$P_{Vi3} = [\tilde{r}(t_i) - \delta, \tilde{v}(t_i) + \eta]$$

$$P_{Vi4} = [\tilde{r}(t_i) - \delta, \tilde{v}(t_i) - \eta]$$

The above additional data $P_V$ are subsequently considered as measured data $P_M$, i.e., the subsequent design step 1004 treats indistinctly the measured data $P_M$ and the additional data $P_V$ in the data-set $D_d$.

In this way, the estimator takes into account the fact that there may be data with equal errors $\delta$, thus improving the characteristics of robustness of the estimator.

The virtual sensor 40 that directly implements the set-membership solution $f^*(\gamma^*, n^*)$ described previously is a robustly optimal solution, which, however, could require computing times and occupation of memory that are not compatible with the performance of the hardware platform on which it has to operate in real time.

In various embodiments, the optional step 1010 thus provides a procedure that enables an approximation $f_a$ of $f^*$ to be obtained, evaluating balancing between degradation of the accuracy of the estimate and reduction of the computing times and of occupation of memory.

For instance, in various embodiments, an approximating function $f_a$ is sought such that $$\frac{|f^*(\tilde{r}(t_i)) - f_a(\tilde{r}(t_i))|}{|f^*(\tilde{r}(t_i))|} \leq \mu, i = n+1, \ldots, N \quad (26)$$

where $\tilde{r}(t_i)$ are the values of the regressors obtained from the measured data in the data-sets $D_d$, and $\mu$ is an assigned level of precision.

In various embodiments, the approximating function $f_a$ is chosen of the form:

$$f_a(r) = \Sigma_{i=1}^{M_s} a_i \phi_i(r) \quad (27)$$

where $\phi_i(r)$ are assigned continuous Lipschitz functions of r, in a high number to enable approximation of vast classes of functions, such as polynomials, sinusoidal functions, exponentials, etc.

In particular, Eqs. (26) and (27) differ from those of the prior art, since the approximated function $f_a(r)$ is not calculated as a function of the measured values $\tilde{v}(t_i)$, but the corresponding estimate $f^*(\tilde{r}(t_i))$ is used, which hence takes into consideration also the limit $\eta$ on the errors of the method of measurement of the variable v and the limit $\delta$ on the disturbances of the data of the variables $u_i$.

Figure 10:
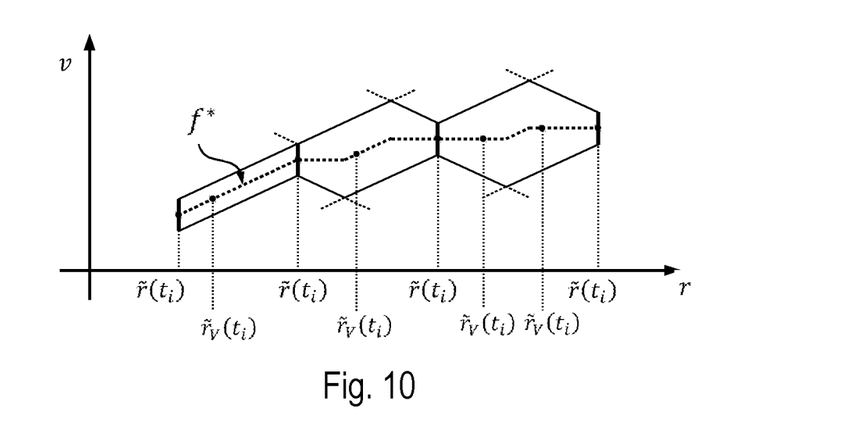
FIG. 10 shows an embodiment that enables reduction of the complexity of the virtual sensor.

FIG. 10 shows an embodiment that enables further improvement of the result of the approximation. In particular, in the embodiment considered, the function $f_a(r)$ is estimated not only using in Eq. (26) the measured regressors $\tilde{r}(t_i)$, i=n+1, ..., N, but also adding further regressors $\tilde{r}_v(t_i)$, which hence increase the number of points used for estimation of the function $f_a(r)$.

In various embodiments, in order to prevent phenomena of overfitting, approximated functions $f_a$ are sought with the minimum number of $a_i \neq 0$ that will in any case guarantee the assigned level $\mu$ of precision to be achieved. This problem is in general an NP-hard problem, so that typically its solution cannot be obtained in computing times that are acceptable for the problems considered in this description. However, it is possible to use approximate solutions proposed in the literature that are such as to lead to a number of elements $a_i \neq 0$, which, even though it is not equal to the minimum number that guarantees the assigned level $\mu$ of precision to be achieved, is in general much smaller than $M_S$; see, for example, the paper by Novara C., Fagiano L., Milanese M., "Sparse Set Membership Identification of Nonlinear Functions", 50th IEEE Conference on Decision and Control, Orlando, 2011, and the references appearing therein.

For instance, in various embodiments, a two-step convex optimisation is used.

We define:

$$a = [a_1, a_2, \ldots, a_{M_s}]$$

$$\Phi = \begin{bmatrix} \phi_1(\tilde{r}(t_{n+1})) & \ldots & [\phi_{M_s}(\tilde{r}(t_{n+1}))] \\ \vdots & \ddots & \vdots \\ [\phi_1(\tilde{r}(t_N))] & \ldots & [\phi_{M_s}(\tilde{r}(t_N))] \end{bmatrix}$$

$$V = [\tilde{v}(t_{n+1}) \ldots \tilde{v}(t_N)]$$

$$z(a) = \{i_1, \ldots, i_j : 0 < |a_{i_1}^1| \leq \ldots \leq |a_{i_j}^1|\}$$

$z_\lambda(a)$: subset of $z(a) \in \lambda = \{1, 2, \ldots, k\}$
card(r(a)): number of elements of r(a)
$\overline{\text{supp}}(a) = \{i \in \{1, 2, \ldots, M_S\} : a_i = 0\}$ In various embodiments, the following optimisation problem is first solved for the initial vector $a^1$:

$$a^1 = \arg \min_{a \in R^{M_s}} \|a\|_1$$

setting the following constraint:

$$\max_{i=n+1, \ldots, N} \frac{|f^*(\tilde{r}(t_i)) - f_a(\tilde{r}(t_i))|}{|f^*(\tilde{r}(t_i))|} \leq \mu$$

In the first step, the vector $a^1$ is thus obtained by solving a convex-optimisation problem, which in general yields a large number of coefficients $a_i^1 = 0$, even though it is not guaranteed that this number is the maximum one possible.

In various embodiments, the optimal vector $a^*$ is then calculated with the following optimisation algorithm:

```
for k = 1: card(r(a¹))
    cᵏ = arg min_{a∈Rᴹ} max_{i=n+1,...,N}|f*(r̃(tᵢ)) - f_a(r̃(tᵢ))|
    with constraint aᵢ = 0, i ∈ supp(a¹) ∪ r_λ(a¹), λ = {1,2, ..., k}
    fᵏ(r̃) = Σ_{k=1}^{Ms} cₖφₖ(r̃)

if max_{i=n+1,...,N} |f*(r̃(tᵢ)) - fᵏ(r̃(tᵢ))| / |f*(r̃(tᵢ))| ≤ μ a* = cᵏ
        break
    end
end
```

Consequently, in the second step only a part of the elements of $a^1$ are progressively included in the vector $a^*$ as long as Eq. (26) applies. In this way, it is possible to obtain a vector $a^*$ the nonzero elements of which are typically in a number $m^*$, which is considerably smaller than that of the initial solution $a^1$. Consequently, the function $f_a^*(r) = \Sigma_{i=1}^{m} a_i^* \phi_i(r)$ yields estimates that differ in the level $\mu$ chosen from the estimate provided by the optimally robust estimator $f^*$, with computing times and occupation of memory that may be significantly lower.

Figure 11:
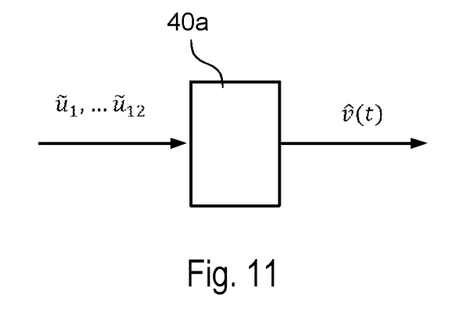
FIGS. 11, 12, and 13 show various embodiments of virtual sensors that are particularly useful for estimating a type of emission of an internal-combustion engine.

FIG. 11 shows in this context a first embodiment of a virtual sensor 40a that is able to estimate the $NO_x$ emission of an engine. For instance, during design of the virtual sensor 40*a* the inputs listed previously have been used, namely, the variables $\tilde{u}_1, \ldots \tilde{u}_{12}$. For instance, the respective design data-set $D_d$ may be obtained with NEDC, WLTP, FTP and Artemis dynamic homologation tests with engine hot and engine cold, with stationary tests, and with real-drive tests, acquired with a respective sampling period, for example, $\Delta t=1$ s.

In various embodiments, the input variables have been modified in such a way as to simulate not only the different operating conditions but also the process spread involved in mass-production of the engine. For instance, in various embodiments, the inputs concerned by the aforesaid perturbations used as inputs of the virtual sensor 40 are $\tilde{u}_3$ (engine torque with a perturbation of ±5%), $\tilde{u}_6$ (temperature in the intake manifold with a perturbation of ±3° C.), and $\tilde{u}_7$ (pressure in the intake manifold with a perturbation of ±40 mbar).

In the embodiment considered, the number of experimental data that constitute the design data-set $D_d$ is $N=10^5$.

Using the design process described previously for implementation on a 32-bit board with a clock frequency of 120 MHz, the estimator $f^*$ obtained with the set-membership procedure requires an occupation of memory of 5 MB and a computing time necessary for estimation of $v^*$, at each sampling period $\Delta t=1$ s, of 780 ms.

Instead, to obtain an estimation function $f_a$ that approximates $f^*$ by evaluating balancing between precision μ, computing times, and occupation of memory, in step 1010 an approximating function has been chosen as in Eq. (27) with a number of polynomial base functions $M_S=N$. In fact, the smaller the value of μ, the more closely $f_a$ approximates $f^*$, but also the occupation of memory and the computing time increase, since the number m* of bases used increases. Choosing, for example, μ=0.05 a function $f_a$ with m*=$10^3$ has been obtained, which, on the board considered, requires an occupation of memory of 15 KB, and a computing time of 6 ms.

Figure 13:
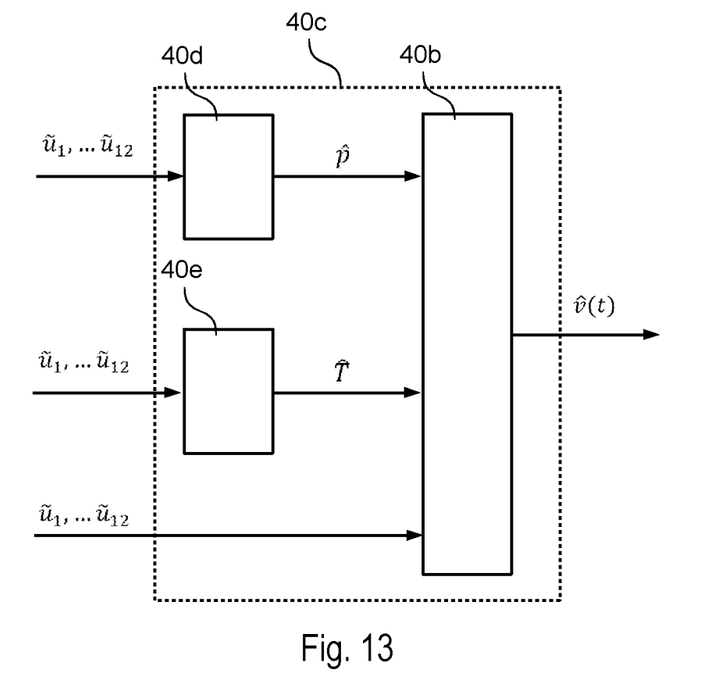

FIG. 13 shows a second embodiment of a virtual sensor 40*b* that is able to estimate the emission of an engine (for example, $NO_x$), where, in addition to the variables $\tilde{u}_1, \ldots \tilde{u}_{12}$, two further available variables $\tilde{u}_{13}$ and $\tilde{u}_{14}$ are also considered, which correspond to the pressure p and to the temperature T in the combustion chamber. The design data-set $D_d$ used for designing the virtual sensor 40 hence comprises measurements also for these variables $\tilde{u}_{13}=p$ and $\tilde{u}_{14}=T$. However, physical sensors for detecting the temperature and pressure in the combustion chamber are costly, and their precision deteriorates rapidly on account of the conditions in which they operate.

FIG. 14 shows a third embodiment of a virtual sensor 40*c* that is able to estimate the emission of an engine (for example, $NO_x$).

In particular, to overcome technological problems of physical sensors for detecting the temperature and pressure in the combustion chamber, the physical sensor for detecting the temperature in the combustion chamber and/or the physical sensor for detecting the pressure in the combustion chamber have/has been replaced with virtual sensors 40*d* and 40*e*. Consequently, in various embodiments, the virtual sensor 40*c* may in actual fact comprise three virtual sensors:

a first virtual sensor 40*d* designed to estimate temperature $\hat{T}$ in the combustion chamber;

a second virtual sensor 40*e* designed to estimate the pressure $\hat{p}$ in the combustion chamber; and a third virtual sensor 40*b* designed to estimate the engine emission (for example, $NO_x$), which receives all the variables $\tilde{u}_1, \ldots \tilde{u}_{14}$, i.e., also the available variables $\tilde{u}_{13}$ and $\tilde{u}_{14}$, which correspond, however, to the estimates $\hat{T}$ and $\hat{p}$ of the temperature and of the pressure in the combustion chamber.

In various embodiments, the virtual sensors 40*a*, 40*b*, 40*d*, and/or 40 can be designed following the process described previously, i.e., on the basis of the set-membership procedure and possibly its consequent approximation.

It may be noted that the estimators 40*d* and 40*e* use as inputs variables that are in any case available in real time. In fact, in general, also the sensors 40*d* and 40*e* can be designed as a function of the available variables $\acute{u}_1, \ldots \ddot{u}_{12}$. For instance, in various embodiments, the virtual sensor 40*d* that is able to estimate the temperature $\hat{T}$ in the combustion chamber is designed only as a function of the variables $\tilde{u}_2$ (engine r.p.m.), $\tilde{u}_3$ (engine torque), and $\tilde{u}_4$ (percentage opening of the EGR valve). Instead, in various embodiments, the virtual sensor 40*e* that is able to estimate the pressure $\hat{p}$ in the combustion chamber is designed only as a function of the variables $\tilde{u}_1$ (fuel demand), $\tilde{u}_2$ (engine r.p.m.), and $\tilde{u}_7$ (pressure in the intake manifold).

Figure 12:
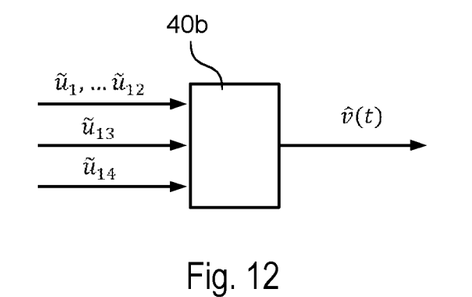

Hence, in the embodiment considered, the entire virtual sensor 40*c* (FIG. 14) uses as inputs $u_i$ those of the virtual sensor 40*a* (FIG. 12), but as compared to the latter enables higher levels of precision to be achieved comparable with those of the virtual sensor 40*b* (FIG. 13). This is justified by the fact that, for the step of design of the virtual sensors 40*b* and 40*d*/40*e*, measurements of pressure/temperature in the combustion chamber (as available variable and as variable of interest, respectively) are used, which are not, instead, used in the design of the single-stage virtual sensor 40*a*. Consequently, in this solution the information content of the design data-set is greater than the information content of the data-set used for the single-stage design, thus enabling improvement of the estimation performance.

Various embodiments of the present disclosure hence regard a virtual sensor 40 (for example, the virtual sensor 40*c*) configured for estimating a variable of interest v and comprising:

a first virtual sensor (for example, the virtual sensor 40*b*) configured for estimating the variable of interest v, where the first virtual sensor is designed according to the process described herein using a design data-set comprising measured values $\tilde{v}(t)$ of the variable of interest and corresponding measured values $\tilde{u}_i$ of a given set of available variables $u_i$, at least one second virtual sensor (for example, the virtual sensors 40*d* and/or 40*e*) configured for estimating a second variable of interest, where the second variable of interest corresponds to one of the available variables $u_i$ used by the first virtual sensor, and where the second virtual sensor is designed according to the process described herein using a second design data-set comprising measured values of the second variable of interest and corresponding measured values $\tilde{u}_i$ of a given second set of available variables $u_i$.

In particular, in various embodiments, the first and second virtual sensors use at least in part the same available variables $u_i$.

Moreover, it would also be possible to design the second virtual sensor first and use, for design of the first virtual sensor, values already estimated with the second virtual sensor.

Of course, without prejudice to the principle of the invention, the details of construction and the embodiments may vary widely with respect to what has been described and illustrated herein purely by way of example, without thereby departing from the scope of the present invention, as defined by the ensuing claims.

The invention claimed is:

1. A computer implemented method of producing a first virtual sensor configured to estimate a variable of interest v as a function of a set of available variables $u_i$ provided by a plurality of sensors, wherein said variable of interest v is indicative of an emission of an internal combustion engine, the method comprising the steps of:
acquiring by means of experimental measurements on a testing internal combustion engine and/or by means of simulations of an accurate model of said internal combustion engine a design dataset $D_d$ comprising a number N of measured values $\tilde{v}(t_i)$ of said variable of interest v and corresponding measured values $\tilde{u}_i(t_i)$ of said available variables $u_i$;
determining a function adapted to estimate the variable of interest v(t) as a function of a respective number n of past values of each available variable $u_i$; and
implementing said function in an electronic circuit, whereby said electronic circuit is configured to estimate said variable of interest v(t) as a function of said set of available variables $u_i$;
wherein the method comprises the steps of:
receiving a boundary δ of the disturbances of said available variables $u_i$ determined as a function of the information on the perturbations of the measurements resulting from process spread involved in production of said internal combustion engine and the different operating conditions of said internal combustion engine, and receiving a boundary η of the measurement errors of the variable of interest v determined as a function of the data of accuracy of the instrument used for measuring the variable of interest v during the experimental tests;
selecting a Lipschitz function $f^*$ with a respective Lipschitz constant (γ) adapted to estimate the variable of interest v(t) as a function of a respective number n of past values of each available variable $u_i$ by executing the following steps one or more times for different numbers n:

a) determining a value for said Lipschitz constant γ with the following equation:

$$y^*(n) = \min_{\gamma : \bar{f}(r(t_i)) > \tilde{v}(t_i) - \eta - \gamma\delta, i=n,n+1,\ldots,N-1} \gamma;$$

b) defining an upper boundary $\bar{f}(r(t))$ and a lower boundary $\underline{f}(r(t))$ for the estimation of said variable of interest v as a function of said design dataset $D_d$, the numbers n, said value for said Lipschitz constant γ, said boundary δ of the disturbances of said available variables $u_i$ and said boundary η of the measurement errors of the variable of interest v, wherein said upper boundary $\bar{f}(r(t))$ and said lower boundary $\underline{f}(r(t))$ for the estimation of said variable of interest v are defined through the following equations:

$$\bar{f}(r(t)) = \min_{i=n,\ldots,N}(\tilde{v}(t_i) + \eta + \gamma\delta + \gamma\|r(t) - \tilde{r}(t_i)\|_\infty)$$

$$\underline{f}(r(t)) = \min_{i=n,\ldots,N}(\tilde{v}(t_i) - \eta - \gamma\delta - \gamma\|r(t) - \tilde{r}(t_i)\|_\infty)$$

c) selecting a Lipschitz function $f^*$ comprised between said upper boundary $\bar{f}(t))$ and said lower boundary $\underline{f}(r(t))$, wherein said selecting a Lipschitz function $f^*$ comprised between said upper boundary $\bar{f}(r(t))$ and said lower boundary $\underline{f}(r(t))$ comprises estimating the value v(t) of the variable of interest v with the average value between the upper boundary $\bar{f}(r(t))$ and the lower boundary $\underline{f}(r(t))$;

d) determining an estimation error ε* ($f^*$) for said Lipschitz function $f^*$ and selecting the Lipschitz function $f^*$, having associated a respective Lipschitz constant γ* and respective numbers n*, which has the lowest estimation error ε* ($f^*(\gamma^*,n^*)$);
implementing said selected Lipschitz function $f^*$ in said electronic circuit.

2. Method according to claim 1, comprising:
modifying said design dataset $D_d$ in order to add values of said variable of interest v and corresponding values of said available variables $u_i$ which do not correspond to measured values but which are within the boundary δ around measured values $\tilde{u}_i(t_i)$ of one or more of said available variables $u_i$ and/or the boundary η around measured values $\tilde{v}(t_i)$ of said variable of interest v.

3. Method according to claim 1, comprising:
approximating said selected Lipschitz function $f^*$ with a function $f_a$ being composed of base functions; and
implementing said approximated Lipschitz function $f_a$ in said electronic circuit.

4. Method according to claim 1, comprising:
designing at least a second virtual sensor adapted to estimate a second variable of interest v as a function of a second set of available variables, wherein the second variable of interest corresponds to one of the available variables $u_i$ in said set of available variables $u_i$ of said first virtual sensor, wherein the second virtual sensor is designed using a second design dataset comprising measured values of said second variable of interest and corresponding measured values for said second set of available variables; and
implementing said first virtual sensor and said second virtual sensor within the same electronic circuit.

5. Method according to claim 1, wherein said set of available variables $u_i$ comprises one or more of the following variables:
fuel demand;
engine r.p.m.;
engine torque;
temperature in the intake manifold;
pressure in the intake manifold;
pressure in the common rail;
flow of exhaust gases in the exhaust manifold;
temperature of the coolant;
concentration of oxygen in the combustion chamber;
absolute humidity;
temperature in the combustion chamber; and
pressure in the combustion chamber.

6. An electronic circuit configured to implement the virtual sensor obtained with the method according to claim 1.

7. A system comprising:
an actuator, such as a combustion motor;
a control unit configured to drive said actuator as a function of at least one control signal, and
at least one electronic circuit configured to implement a virtual sensor (40) obtained with the method according to claim 1.

8. A computer-program product that can be loaded into the memory of at least one processor and comprises portions of software code for implementing the steps of the method according to claim 1.

9. A computer-program product that can be loaded into the memory of at least one processor and comprises portions of software code for implementing a virtual sensor obtained with the method according to claim 1.

10. Method according to claim 1, wherein said variable of interest v is indicative of an emission of $NO_x$ of said internal combustion engine.

11. Method according to claim 1, where the estimation error $\varepsilon^* (f^*)$ is calculated according to the following equation:

$$\varepsilon^*(f^*(\gamma^*, n)) = \sup_{r \in R_b} (\overline{f}(r) - \underline{f}(r)) \Big/ 2 + \gamma^*(n)\delta.$$

* * * * *